United States Patent
Hsieh et al.

(10) Patent No.: US 9,955,268 B2
(45) Date of Patent: Apr. 24, 2018

(54) MICRO-ELECTRICAL-MECHANICAL SYSTEM (MEMS) MICROPHONE

(71) Applicant: Solid State System Co., Ltd., Hsinchu (TW)

(72) Inventors: Tsung-Min Hsieh, New Taipei (TW); Chien-Hsing Lee, Hsinchu County (TW); Cheng-Wei Tsai, Taichung (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 14/328,727

(22) Filed: Jul. 11, 2014

(65) Prior Publication Data

US 2015/0315013 A1 Nov. 5, 2015

(30) Foreign Application Priority Data

Apr. 30, 2014 (TW) .............................. 103115580 A

(51) Int. Cl.
*B81B 7/00* (2006.01)
*H04R 23/00* (2006.01)
*H04R 19/00* (2006.01)

(52) U.S. Cl.
CPC ......... *H04R 19/005* (2013.01); *B81B 7/0058* (2013.01); *H04R 23/006* (2013.01); *B81B 7/0006* (2013.01); *B81B 2201/0257* (2013.01); *H04R 2201/003* (2013.01); *H04R 2460/11* (2013.01)

(58) Field of Classification Search
USPC .......................... 257/416, 417, 628, E29.001
See application file for complete search history.

(56) References Cited

U.S. PATENT DOCUMENTS

| 2010/0052082 A1* | 3/2010 | Lee ...................... B81B 7/0061 257/416 |
| 2010/0086146 A1* | 4/2010 | Gong .................... B81C 1/0023 381/91 |

FOREIGN PATENT DOCUMENTS

| CN | 203072153 | 7/2013 |
| CN | 101665230 | 8/2013 |
| TW | 200844035 | 11/2008 |
| TW | 201034476 | 9/2010 |
| TW | I333264 | 11/2010 |

(Continued)

OTHER PUBLICATIONS

"Office Action of Taiwan Counterpart Application", dated Jun. 14, 2016, p. 1-p. 8.

(Continued)

*Primary Examiner* — Ori Nadav
*Assistant Examiner* — Vernon P Webb
(74) *Attorney, Agent, or Firm* — JCIPRNET

(57) ABSTRACT

A micro-electrical-mechanical system (MEMS) microphone includes a MEMS structure, having a substrate, a diaphragm, and a backplate, wherein the substrate has a cavity and the backplate is between the cavity and the diaphragm. The backplate has multiple venting holes, which are connected to the cavity and allows the cavity to extend to the diaphragm. Further, an adhesive layer is disposed on the substrate, surrounding the cavity. A cover plate is adhered on the adhesive layer, wherein the cover plate has an acoustic hole, dislocated from the cavity without direct connection.

8 Claims, 4 Drawing Sheets

(56) References Cited

FOREIGN PATENT DOCUMENTS

| | | |
|---|---|---|
| TW | 201110712 | 3/2011 |
| TW | I419831 | 12/2013 |
| TW | M473663 | 3/2014 |
| TW | M476132 | 4/2014 |

OTHER PUBLICATIONS

"Office Action of Taiwan Counterpart Application," dated Feb. 14, 2017, p. 1-p. 6.

* cited by examiner

MICRO-ELECTRICAL-MECHANICAL SYSTEM (MEMS) MICROPHONE

CROSS-REFERENCE TO RELATED APPLICATION

This application claims the priority benefit of Taiwan application serial no. 103115580, filed on Apr. 30, 2014. The entirety of the above-mentioned patent application is hereby incorporated by reference herein and made a part of this specification.

BACKGROUND OF THE INVENTION

Field of the Invention

The present invention generally relates to Micro-Electrical-Mechanical System (MEMS) microphone, in particular, to a MEMS microphone with effects of dust resistance.

Description of Related Art

The MEMS microphone is a microphone device with rather tiny size and is fabricated by semiconductor fabricating processes, so that it can be connected to integrated circuit in semiconductor fabricating processes.

FIG. 1 schematically illustrates a conventional MEMS microphone. In FIG. 1, the conventional MEMS microphone includes a MEMS structure 101. The MEMS structure 101 includes a substrate 100. The substrate 100 can be semiconductor substrate, for example, such as silicon substrate. By using photolithographic and etching processes in semiconductor fabricating processes, a cavity 112 is formed in the substrate 100 for receiving the external acoustic source.

The micro capacitor 104 includes a diaphragm 108 and a backplate 106, and a chamber 124 is formed from the space between the diaphragm 108 and the backplate 106. The chamber 124 is usually filled with air, which serves as the acoustic medium. Thus, the diaphragm 108 and the backplate 106 form a micro capacitor 104, having corresponding capacitance. The backplate 106 includes conductive material, such as polysilicon, and is formed with a plurality of venting holes 110 to connect to the cavity 112, so that the cavity 112 can extend to the diaphragm 108. This, when the cavity 112 receive the acoustic source, the diaphragm 108 can sense the acoustic source and then vibrates, resulting in variance of capacitance. The MEMS microphone can provide the signal with the variance of capacitance. The integrated circuit or system, externally connected to the MEMS microphone, can detect out the content of the acoustic source, according to the signal with the variance of capacitance.

In the semiconductor fabrication for fabricating the micro capacitor 104, the photolithographic and etching processes involve the dielectric layer for auxiliary function to be performed. The residue of dielectric material is indicated by the dielectric layer 102. The dielectric layer 102 can be used to hold the diaphragm 108. The one with ordinary skill in the art can understand that fabrication process to form the micro capacitor 104 by using the dielectric layer 102. The details are not further described here.

In addition, in order to protect the diaphragm 108 and maintain the sensitivity of the diaphragm 108, a capping structure 114 is formed over the dielectric layer 102 at another side opposite to the side having the substrate 100. The capping structure 114, for example, uses a glue layer 116 to adhere to the dielectric layer 102. The capping structure 114 has an indent space 120 corresponding to the cavity 112. The indent space 120 is sufficiently large to allow that the vibration of the diaphragm 108 is not significantly restricted. Furthermore, the capping structure 114 also has interconnect structure 118, for example, including conductive pad and conductive plug, so the electric signal sensed by the micro capacitor 104 can be outputted to the external integrated circuit for subsequent use.

As investigating into the conventional MEMS microphone above by the invention, the cavity 112 of the substrate 100 is directly connected to the external ambiance. When micro-particles 128 enter the cavity 112, some of the micro-particles 128 with relative smaller size may further pass the venting holes 110 and enter the chamber 124 between the backplate 106 and the diaphragm 108. This phenomenon would reduce the vibration of the diaphragm 108 during sensing the acoustic source, or even cause the diaphragm 108 to be incapable of sufficient vibration, resulting in malfunction.

FIG. 2 schematically illustrates another conventional MEMS microphone. In FIG. 2, the MEMS structure 202 of another design of the conventional MEMS microphone 202 is similar to the MEMS structure 101 in FIG. 1 but the packaging structure as a whole is different. The MEMS structure 202 is disposed on the cover plate 200. This cover plate 200 can be a circuit board, for example, including the interconnect structure 204, so the MEMS structure 202 is involved in the bonding step under the packaging process, in which the bonding wire 206 electrically connects the MEMS structure 202 to the interconnect structure 204 of the cover plate 200. As a result, the sensing signal from the MEMS structure 202 can be outputted, and provide the signal for use by the externally-connected integrated circuit or system.

To protect the MEMS structure 202, having the diaphragm 108 and the bonding wire 206, the capping structure 210 is disposed on the cover plate 200 and covering over the MEMS structure 202. A space between the capping structure 210 and the MEMS structure 202 allows the diaphragm 108 to vibrate as designed at the desired sensitivity. For this conventional MEMS microphone, the cover plate 200 has an acoustic hole 208, which is directly connected to the cavity 112 to receive the acoustic source. As a result from investigating to this MEMS microphone in the invention, the acoustic hole 208 is directly connected to the cavity 112. In this manner like the micro-particles 128 in FIG. 1, the micro-particles 128 may enter the chamber 124 and then cause malfunction to the diaphragm 108.

SUMMARY OF THE INVENTION

The invention provides MEMS microphone, and can reduce the probability for the micro-particles to enter the chamber. Then the MEMS microphone is proper protected to have normal operation function.

As an exemplary embodiment, the MEMS microphone in the invention includes MEMS structure, having a substrate, a diaphragm, and a backplate. The substrate has a cavity and the backplate is between the cavity and the diaphragm. The backplate has multiple venting holes, which are connected to the cavity and allows the cavity to extend to the diaphragm. Further, an adhesive layer is disposed on the substrate, surrounding the cavity. A cover plate is adhered on the adhesive layer, wherein the cover plate has an acoustic hole, dislocated from the cavity without direct connection.

In an embodiment, the adhesive layer of the above MEMS microphone can be a closely surrounding the cavity.

In an embodiment, the substrate of the above MEMS microphone can further have a trench channel, which connects the acoustic and the cavity.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
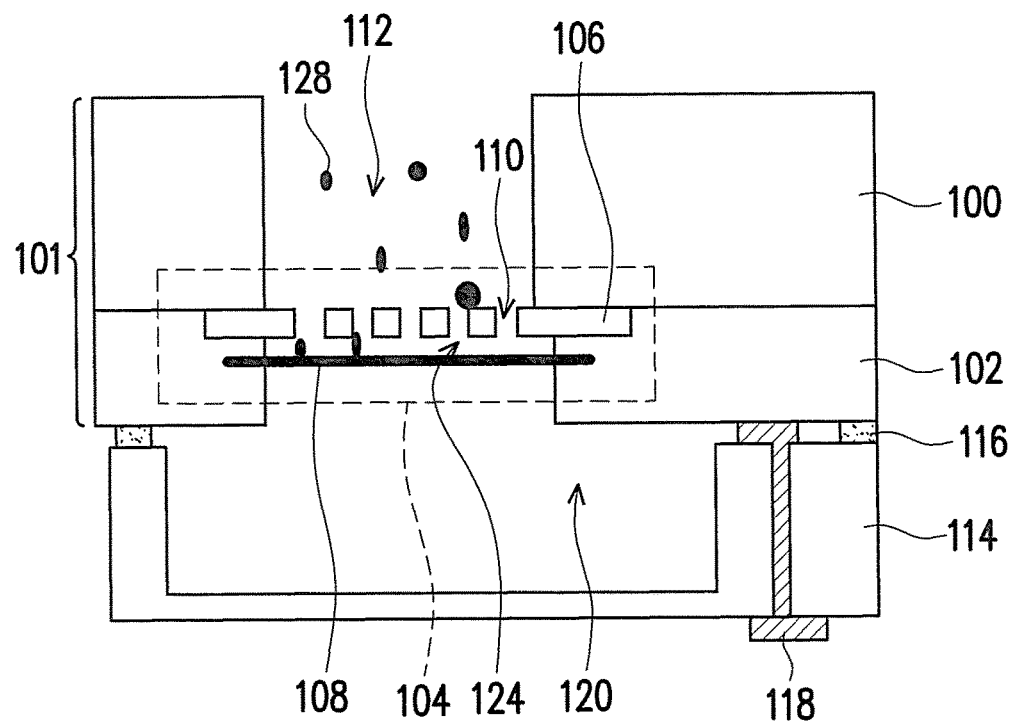
FIG. 1 schematically illustrates a conventional MEMS microphone.

Reference will now be made in detail to the present preferred embodiments of the invention, examples of which are illustrated in the accompanying drawings. Wherever possible, the same reference numbers are used in the drawings and the description to refer to the same or like parts.

The invention investigates into the conventional MEMS microphone, in which the micro-particles very possibly enter the cavity from the acoustic hole, and then enter the chamber when passing the venting holes. As a result, the performance for the diaphragm may be reduced or even that the diaphragm does not work. The invention then provides multiple embodiments for description but not just limited to the embodiments as provided. Further a proper combination may be made between embodiments.

Figure 3:
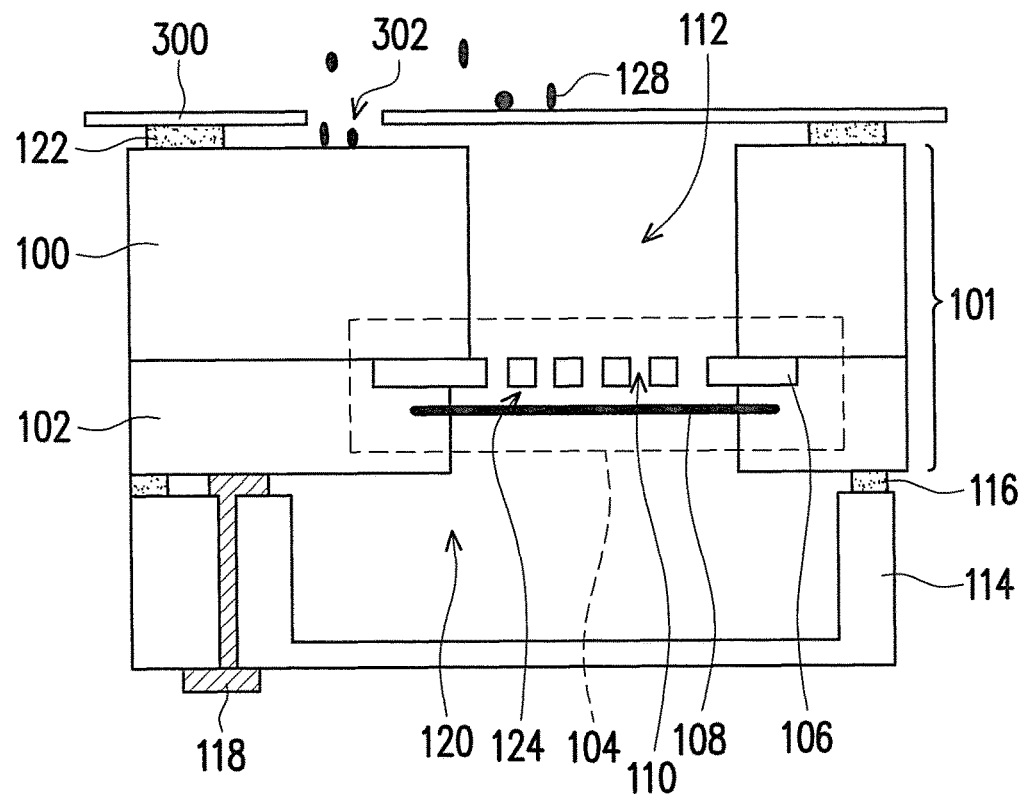
FIG. 3 schematically illustrates a cross-sectional view of a MEMS microphone, according to an embodiment of the invention.
Figure 4:
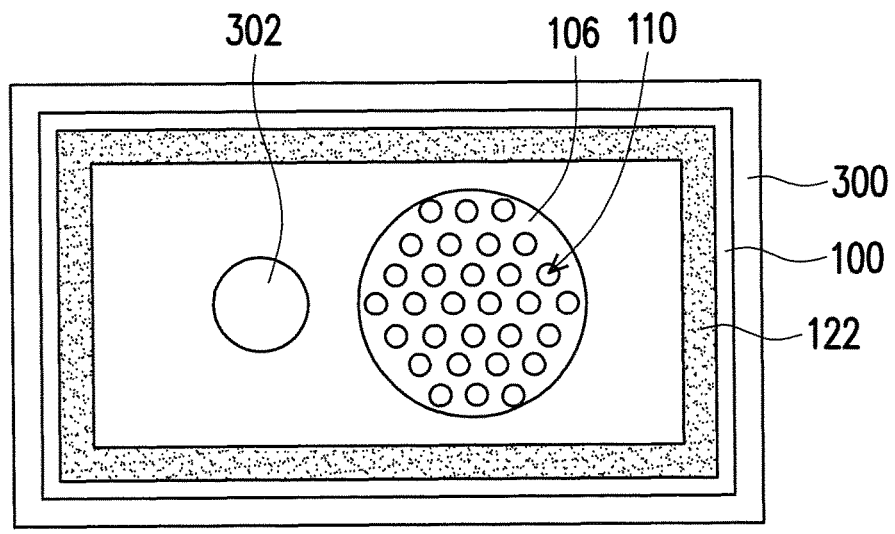
FIG. 4 schematically illustrates a top view of a part of the MEMS microphone in FIG. 3, according to an embodiment of the invention.

FIG. 3 schematically illustrates a cross-sectional view of a MEMS microphone, according to an embodiment of the invention. FIG. 4 schematically illustrates a top view of a part of the MEMS microphone in FIG. 3, according to an embodiment of the invention. In FIG. 3 and FIG. 4, the structure of the MEMS microphone includes MEMS structure 101, having a substrate 100, a backplate 106 and a diaphragm 108. The substrate 100 has a cavity 112 and the backplate 116 is disposed between the cavity 112 and the diaphragm 108. The backplate 106 has multiple venting holes 110, which connect to the cavity 112, so the cavity 112 can extend to diaphragm 108 via the chamber 124. In addition, the adhesive layer 122 is disposed on the substrate 100, surrounding the cavity 112. The cover plate 300 is adhered to the adhesive layer 112, in which the cover plate 300 has an acoustic hole 302. A location of the acoustic hole is dislocated from the cavity 112 without direct connection. The acoustic hole 302 and the cavity 112 are indirectly connected. In this embodiment, the thickness of the adhesive layer 122 is used to produce a gap between the cover plate 300 and the substrate 100, so the indirect connection is done by the gap. Since the acoustic hole 302 is not directly connected to cavity 112, even if the micro-particles 128 enter from the acoustic hole 128, most part of the micro-particles would stay on the surface of the substrate 100. As a result, the micro-particles 128 is significantly reduced to enter the cavity 112, and the probability for the micro-particles 128 to further enter the chamber 124 is also significantly reduced. The diaphragm 108 then can work with the normal performance.

The geometric shape of the periphery of the acoustic hole 302 is not limited to circular and can be other option, such as one form square, rectangular, triangular, polygonal, elliptic, . . . , and so on. Also, with the same manner, the number of the acoustic hole 302 is not limited to one. The number of acoustic hole 302 can be larger than 1.

Furthermore, the adhesive layer 122 can be closely surrounding the cavity 112, and the surrounding shape of the adhesive layer 122 is also not limited to the rectangular and can be other shape, such as a smooth ring or any other can surround the cavity 112. The material of the adhesive layer 122 can be, for example, glue layer, and further can be, for example, conductive glue or non-conductive glue. The adhesive layer 122 is used for adhere the cover plate 300 and the acoustic gap as needed. The sub-structure inside the adhesive layer 122 is also not limited to. For example, the adhesive layer 122 can be a stack of multiple layers.

In addition, the MEMS structure 101 in an embodiment can also include the capping structure 114 as disclosed in FIG. 1 to cover over the diaphragm 108, in which the capping structure 114 is adhered to one side of the MEMS structure 101 by the glue layer 116 is at an opposite side to the side having the cover plate 300. An interconnect structure 118 may also be included inside the capping structure 114, so the electric signal sensed by the micro capacitor 104 can be outputted for subsequent use.

Furthermore, in the embodiment of FIG. 3, the acoustic hole 302 and the cavity 112 are indirectly connected by the gap produced by the adhesive layer 122 between the cover plate 300 and the substrate 100. However, the amount of acoustic source to enter the acoustic hole 302 and then enter the cavity 112 can be increased by further forming a trench channel. Another embodiment is provided for descriptions.

Figure 5:
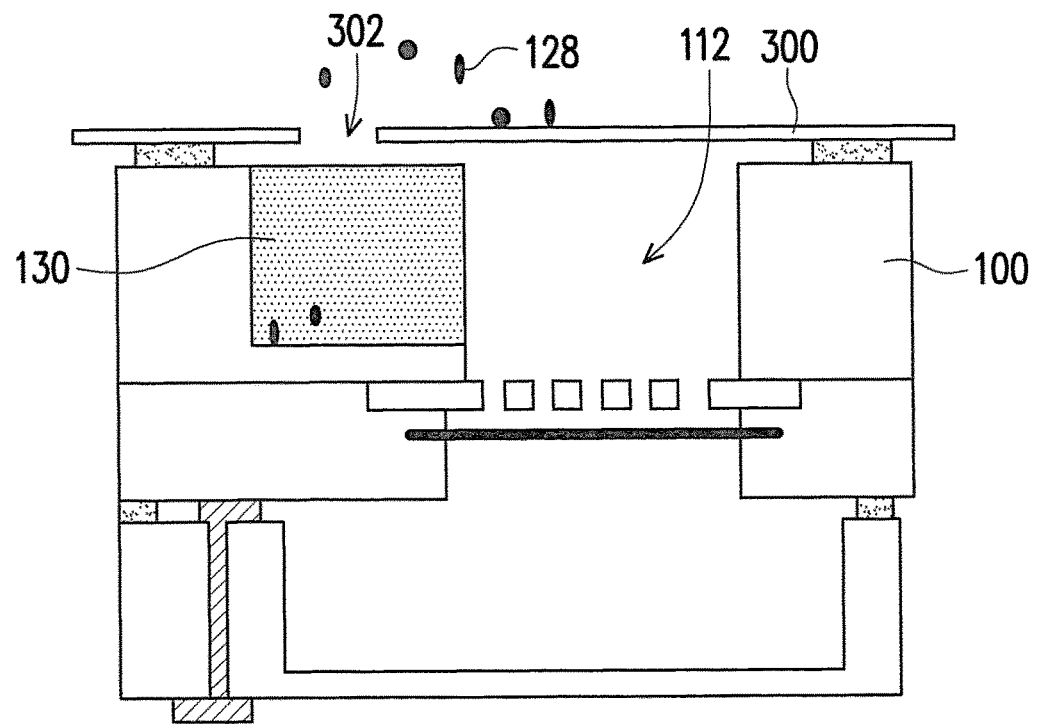
FIG. 5 schematically illustrates a cross-sectional view of a MEMS microphone, according to an embodiment of the invention.
Figure 6:
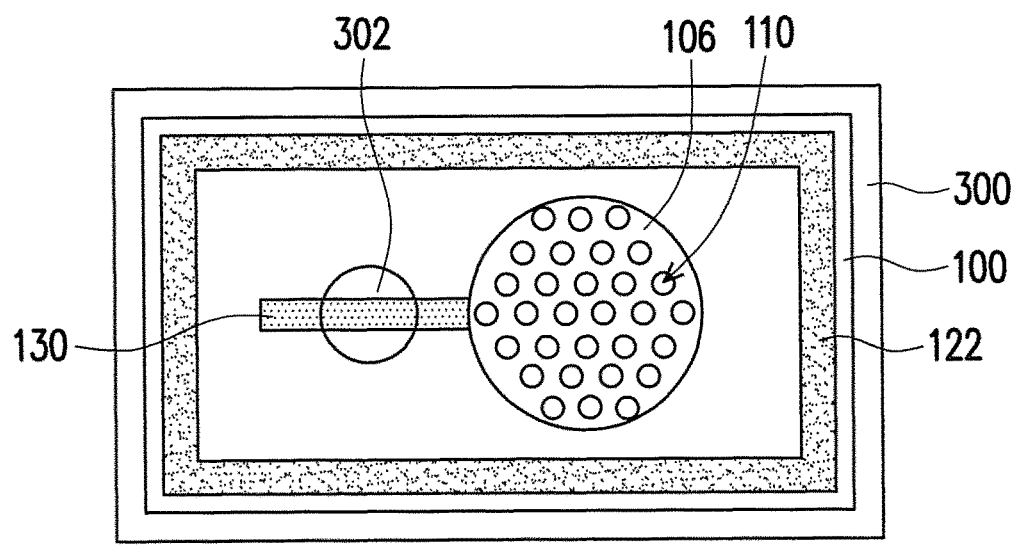
FIG. 6 schematically illustrates a top view of a part of the MEMS microphone in FIG. 3, according to an embodiment of the invention.

FIG. 5 schematically illustrates a cross-sectional view of a MEMS microphone, according to an embodiment of the invention. FIG. 6 schematically illustrates a top view of a part of the MEMS microphone in FIG. 3, according to an embodiment of the invention.

In FIG. 5 and FIG. 6, the structure of the MEMS microphone in the embodiment is based on the MEMS microphone as shown in FIG. 3, but a trench 130 is further formed in the substrate 100, so to produce a larger channel for connecting the acoustic hole 302 of the cover plate 300 and the cavity 112 of the substrate 100. Thus, the cavity 112 can receive more amount of the acoustic source.

In addition, since the trench 130 and the cavity 112 is connected in transverse direction, at least a part of the micro-particles 128 entering from the acoustic hole 302 can also fall into the bottom of the trench 130. The trench 130 can also have the effect for micro-particle resistance and the increase the level of the acoustic source being received. Here, the trench 1300 is just an example. For the actual design of the trench 130 can be any other but maintain the feature to connect the acoustic 302 and the cavity 112 and absorb the micro-particles 128 from the acoustic hole 302. The actual size and the geometric structure can be changed according to the actual need.

Figure 2:
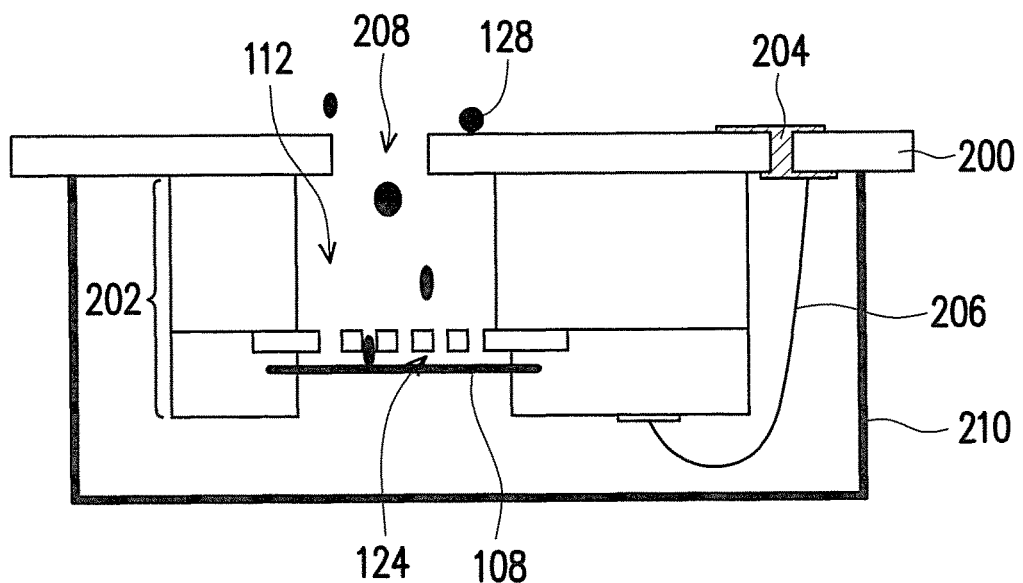
FIG. 2 schematically illustrates another conventional MEMS microphone.
Figure 7:
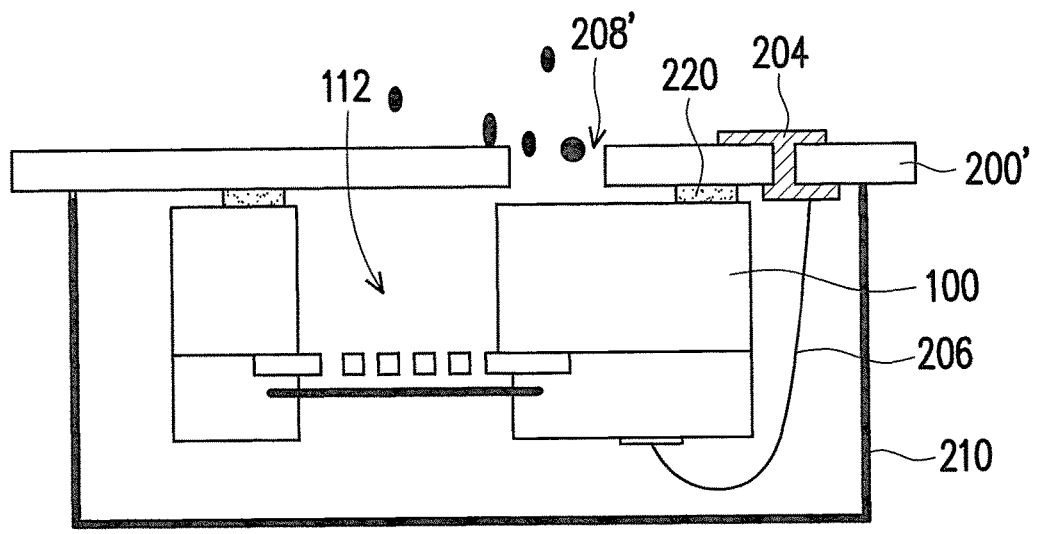
FIG. 7 schematically illustrates a cross-sectional view of a MEMS microphone, according to an embodiment of the invention.

FIG. 7 schematically illustrates a cross-sectional view of a MEMS microphone, according to an embodiment of the invention. In FIG. 7, the structure of the MEMS microphone in the embodiment is based on the MEMS microphone as shown in FIG. 3 with the similar mechanism to resist the micro-particles. The cover plate 200' is adhered to the substrate 100 by also using the adhesive layer 220. The acoustic hole 208' of the cover plate 200' is also dislocated from the cavity 112, without direct connection, in which the mechanism is described in FIG. 3. The cover plate 200' in the embodiment can also be a circuit board. The structure of the interconnect structure 204 and the bonding wire 206 in the capping structure 210 and the cover plate 200' as shown in FIG. 2 is described. The material of the capping structure 210 can be metal or non-metal. The choice of metallic material can further prevent the interference of electromagnetic wave. The conventional MEMS microphone as shown in FIG. 2 can be improved by the invention to reduce the micro-particles to renter the chamber.

Figure 8:
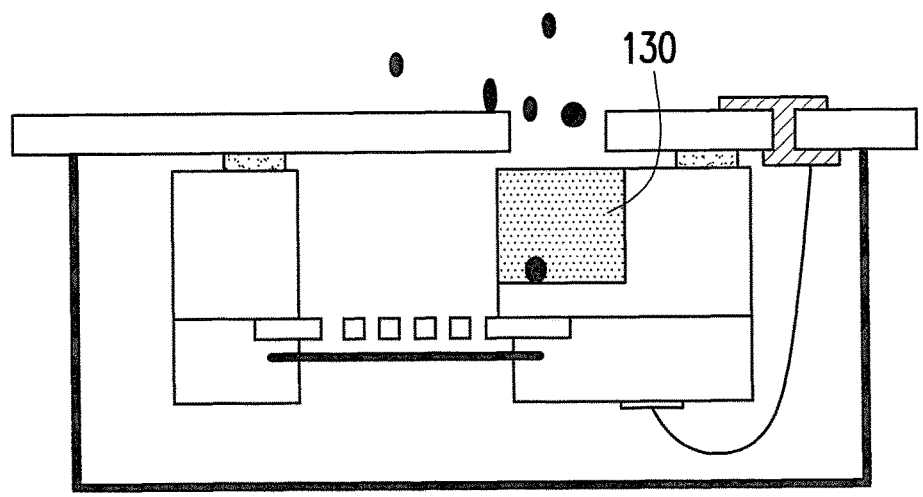
FIG. 8 schematically illustrates a cross-sectional view of a MEMS microphone, according to an embodiment of the invention.

FIG. 8 schematically illustrates a cross-sectional view of a MEMS microphone, according to an embodiment of the invention. In FIG. 8, the MEMS microphone is based on the structure in FIG. 7. In addition, the structure in FIG. 5 is taken in combination to form the trench 130 in the substrate 100. As a result, the amount of acoustic source being received can be increased.

In the invention, the adhesive layer 122 is used to adhere the cover plate 300. Since the thickness of the adhesive layer 122 provides the transverse acoustic channel, the acoustic hole of the cover plate 300 can be dislocated form the cavity, and are connected by the transverse acoustic channel. The MEMS microphone can still receive the acoustic source. In addition, since the acoustic hole and the cavity are dislocated to each other, it can effectively reduce the possibility for the micro-particles to enter the chamber of the MEMS microphone. So, it can prevent the reduction of the vibration performance of the diaphragm to sense sound.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A micro-electrical-mechanical system (MEMS) microphone comprising:

a MEMS structure, having a semiconductor substrate, a diaphragm, and a backplate, wherein the diaphragm and the backplate are formed over a surface of the semiconductor substrate, wherein the semiconductor substrate has a cavity and the backplate is between the cavity and the diaphragm, the backplate has multiple venting holes, connecting to the cavity and allowing the cavity to extend to the diaphragm;

an adhesive layer, disposed on the semiconductor substrate, surrounding the cavity; and a cover plate, adhered on the adhesive layer, wherein a thickness of the adhesive layer provides a gap between the MEMS structure and the cover plate, wherein an acoustic hole is formed as a through hole in the cover plate, the acoustic hole is dislocated from the cavity and is connected to the cavity by the gap directly under the cover plate and through a space in the gap, wherein the cavity inside the semiconductor substrate is covered by the cover plate and is separate from the cover plate by the gap between the semiconductor substrate and the cover plate caused by the adhesive layer.

2. The MEMS microphone of claim 1, wherein the adhesive layer is closely surrounding the cavity.

3. The MEMS microphone of claim 1, wherein the semiconductor substrate of the MEMS structure has a trench channel indent in the semiconductor substrate of the MEMS structure, in connection between the acoustic hole and the cavity.

4. The MEMS microphone of claim 1, further comprising capping structure on one side of the MEMS structure, opposite to the cover plate, to covering over the diaphragm, wherein inside of the capping structure includes an interconnect structure.

5. The MEMS microphone of claim 1, further comprising capping structure on the cover plate and the covering over the MEMS structure, wherein the cover plate include interconnect structure.

6. The MEMS microphone of claim 1, wherein a dielectric layer is disposed over the surface of the semiconductor substrate against the cover plate to hold the diaphragm.

7. The MEMS microphone of claim 1, wherein the diaphragm and the backplate form a sensing capacitor.

8. The MEMS microphone of claim 1, wherein the adhesive layer is conductive glue or non-conductive glue.

* * * * *